(12) United States Patent
Ceballos et al.

(10) Patent No.: US 11,929,719 B2
(45) Date of Patent: Mar. 12, 2024

(54) SUPER SOURCE FOLLOWER

(71) Applicant: Infineon Technologies AG, Neubiberg (DE)

(72) Inventors: Jose Luis Ceballos, Villach (AT); Fulvio CiCiotti, Villach (AT); Benno Muehlbacher, St. Magdalen (AT); Andreas Wiesbauer, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 69 days.

(21) Appl. No.: 17/658,143

(22) Filed: Apr. 6, 2022

(65) Prior Publication Data

US 2023/0327614 A1    Oct. 12, 2023

(51) Int. Cl.
  *H03F 3/183*    (2006.01)
  *H04R 3/00*    (2006.01)
  *H04R 19/04*    (2006.01)
(52) U.S. Cl.
  CPC ............... *H03F 3/183* (2013.01); *H04R 3/00* (2013.01); *H04R 19/04* (2013.01); *H03F 2200/03* (2013.01); *H04R 2201/003* (2013.01)
(58) Field of Classification Search
  CPC ....... H03F 3/183; H03F 2200/03; H04R 3/00; H04R 19/04; H04R 2201/003
  See application file for complete search history.

(56) References Cited

U.S. PATENT DOCUMENTS

| | | | |
|---|---|---|---|
| 8,610,497 B2 | 12/2013 | Kropfitsch et al. | |
| 9,083,286 B2 | 7/2015 | Kropfitsch et al. | |
| 9,181,080 B2 | 11/2015 | Dehe et al. | |
| 9,214,911 B2 | 12/2015 | Kropfitsch et al. | |
| 9,806,687 B2 | 10/2017 | Valli et al. | |
| 9,828,237 B2 | 11/2017 | Walther et al. | |
| 9,866,939 B2 | 1/2018 | Polo et al. | |
| 9,986,344 B2 | 5/2018 | Dehe et al. | |
| 10,189,699 B2 | 1/2019 | Walther et al. | |
| 10,250,999 B1 | 4/2019 | Polo et al. | |
| 10,506,318 B2 | 12/2019 | Polo et al. | |
| 11,161,735 B2 | 11/2021 | Strasser et al. | |
| 2015/0318829 A1 | 11/2015 | Astgimath | |
| 2018/0175827 A1 | 6/2018 | Chen et al. | |
| 2020/0321921 A1* | 10/2020 | Mathew | H03F 1/301 |

OTHER PUBLICATIONS

Takhti, Mohammad "Structured Design Methodology to Achieve a High SNR Electrical Impedance Tomography", IEEE Transactions on Biomedical Circuits and Systems, vol. 13, Issue: 2, Apr. 2019, 12 pages.
Vidojkovic, Vojkan et al., "CMOS Low-Power Transceivers for 60GHz Multi Gbit/s Communications", Proceedings of the IEEE 2013 Custom Integrated Circuits Conference, Sep. 22-25, 2013, 8 pages.
Shedge, D. K., et al., "A CMOS Source Follower and Super Source Follower", Proc. of Int. Conf. on Advances in Electrical & Electronics 2012, India, Mar. 30, 2012, 4 pages.

* cited by examiner

*Primary Examiner* — David L Ton
(74) *Attorney, Agent, or Firm* — Slater Matsil, LLP

(57) ABSTRACT

In accordance with an embodiment, a circuit includes: a first super source follower; a compensation circuit having a compensating node configured to provide a voltage of opposite phase of a voltage of an internal node of the first super source follower; and a first compensation capacitor coupled between an input of the first super source follower and the compensating node of the compensation circuit.

20 Claims, 5 Drawing Sheets

SUPER SOURCE FOLLOWER

TECHNICAL FIELD

The present invention relates generally to electronic systems and methods, and, in particular embodiments, to a system and method for a super source follower.

BACKGROUND

Small-scale sensors are used in a wide variety of applications such as pressure sensor systems, ultrasound systems, and audio frequency microphone systems. To support the reduced size of these end products, these sensors may be implemented using micro-electro-mechanical systems (MEMS).

In a MEMS microphone, for example, a pressure sensitive diaphragm is etched directly onto an integrated circuit. The monolithic nature of the MEMS microphone produces a higher yielding, lower cost microphone compared to other microphone technologies, such as electret condenser microphones (ECM).

The interfacing of a MEMS microphone or sensor with an electrical system, however, poses a number of difficulties because of the microphone's very high output impedance. For example, loading by the preamplifier can potentially attenuate the microphone's output signal, and the high output impedance of the MEMS microphone makes it prone to electromagnetic interference (EMI) and power supply disturbances.

To address these issues, a number of solutions have been implemented. For example, high input impedance amplifiers such as "super source follower" circuits may reduce input attenuation, and multiple membrane MEMS devices that provide differential outputs may reduce the effect of EMI and power supply disturbances. However, the practical implementation of these circuits may be prone to underdamped responses and self-oscillations due to the interaction between the self-resonance of the MEMS device and the negative real part input impedance of the high input impedance amplifier.

SUMMARY

In accordance with an embodiment, a circuit includes: a first super source follower; a compensation circuit having a compensating node configured to provide a voltage of opposite phase of a voltage of an internal node of the first super source follower; and a first compensation capacitor coupled between an input of the first super source follower and the compensating node of the compensation circuit.

In accordance with another embodiment, a circuit includes: a first super source follower having an input configured to be coupled to a first output terminal of a MEMS device; a second super source follower having an input configured to be coupled to a second output terminal of the MEMS device; a first capacitor coupled between the input of the first super source follower and an internal node of the second super source follower; and a second capacitor coupled between the input of the second super source follower and an internal node of the first super source follower.

In accordance with a further embodiment, a method includes: amplifying, by a first super source follower, a first output signal from a MEMS device to produce a first amplified output signal; amplifying, by a second super source follower, a second output signal from the MEMS device to produce a second amplified output signal; compensating a negative real input resistance of the first super source follower by coupling a first compensating signal generated by the second super source follower to an input of the first super source follower; and compensating a negative real input resistance of the second super source follower by coupling a second compensating signal generated by the first super source follower to an input of the second super source follower.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In accordance with an embodiment, a super source follower amplifier includes a compensation capacitor coupled between a gate of a source follower transistor and node that has an opposite phase of the drain of the source follower transistor. The value of the compensation capacitor may be set to fully or partially compensate for the effect of the gate-drain capacitance of the source follower transistor in contributing to a negative input resistance of the super source follower. Using the compensation capacitor advantageously reduces or eliminates self-sustained oscillations at or near the self-resonance frequency of a MEMS device coupled to the input of the super source follower amplifier.

Figure 1:
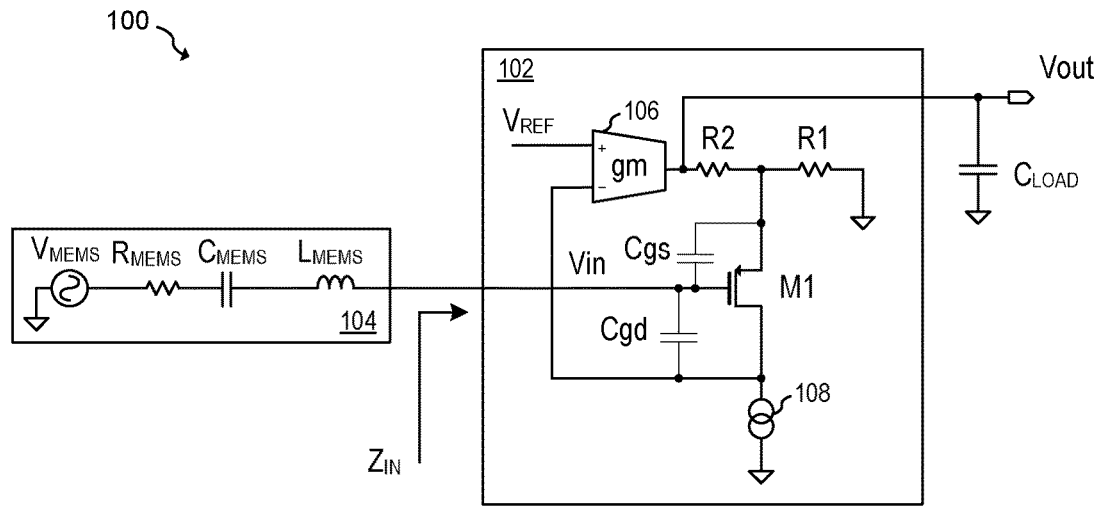
FIG. 1 illustrates an exemplary super source follower circuit.

FIG. 1 illustrates a schematic of an exemplary MEMS sensor system 100 that includes a MEMS sensor 104 coupled to a super source follower amplifier 102. MEMS sensor 104 could be a MEMS pressure sensor or an acoustic sensor, such as a microphone or ultrasonic sensor. For the purpose of analysis, however, MEMS sensor 104 is shown modeled as an AC voltage source $V_{MEMS}$ coupled to a series RLC circuit that includes resistor $R_{MEMS}$, capacitor $C_{MEMS}$ and inductor $L_{MEMS}$, such that the resonant frequency $f_R$ of MEMS sensor 104 is:

$$f_R = \frac{1}{2\pi\sqrt{L_{MEMS}C_{MEMS}}} \text{ Hz}.$$

It should be understood that voltage source $V_{MEMS}$, resistor $R_{MEMS}$, capacitor $C_{MEMS}$ and inductor $L_{MEMS}$ represent the output impedance and dynamic behavior of the MEMS sensor 104 and are not necessarily physical electronic components (e.g. a resistor, capacitor and inductor) in and of themselves.

Super source follower amplifier 102 includes a source follower transistor M1, current source 108, transconductance amplifier 106 and a voltage divider formed by resistors R1 and R2. The output of super source follower amplifier 102 is shown coupled to capacitor $C_{LOAD}$, which represents a load capacitance of a further circuit coupled to the output of super source follower amplifier 102.

As shown, the gate (also referred to as a "control node") of source follower transistor M1 is connected to the output of MEMS sensor 104, the source (also referred to as a "reference node") of source follower transistor M1 is coupled to resistors R1 and R2, and the drain (also referred to as an "output node") of source follower transistor M1 is connected to current source 108 and the input of transconductance amplifier 106. The feedback loop formed by source follower transistor M1, transconductance amplifier 106 and resistors R2 and R1 provides a low output impedance at node Vout, and sets the voltage gain of super source follower amplifier 102 to be about 1+R2/R21. Super source follower amplifier 102 can be considered a current feedback amplifier in which the feedback current is supplied to the negative input of transconductance amplifier 106 via the drain of source follower transistor M1. Voltage $V_{REF}$ coupled to the positive input of transconductance amplifier 106 represents a reference voltage. This reference voltage may be provided by a reference voltage generation circuit or may be implicitly generated within transconductance amplifier 106 itself (e.g. via a threshold voltage of an input transistor).

While super source follower amplifier 102 is well suited for interfacing with MEMS sensor 104 due to its high input impedance and low output impedance, one drawback of super source follower amplifier 102 is that its input impedance $Z_{IN}$ has a negative real part in some circumstances due to signal coupling from the output of super source follower amplifier 102 back to its input at node Vin via parasitic gate-source capacitance Cgs and parasitic gate-drain capacitance Cgd of source follower transistor M1. The presence of this negative real resistance can cause sustained oscillations and/or underdamped responses at or about the resonant frequency fr of MEMS sensor 104. These sustained oscillations and underdamped responses may degrade the performance of MEMS sensor system 202 by reducing available headroom, producing unwanted signals, and causing distortion.

Figure 2A:
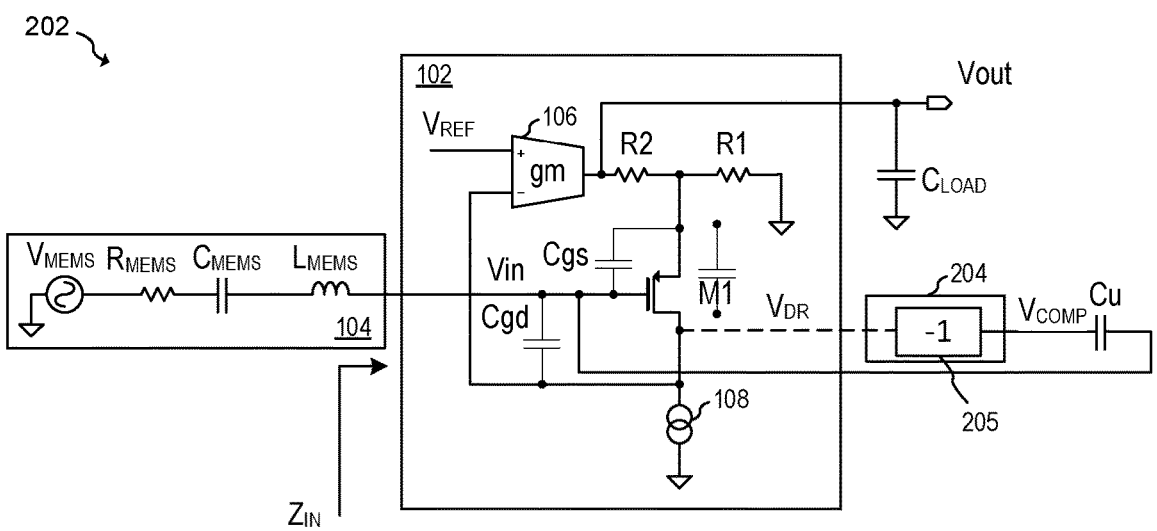
FIGS. 2A and 2B illustrate embodiment super source follower circuits.

FIG. 2A illustrates a MEMS sensor system 200 according to an embodiment of the present invention that includes MEMS sensor 104, super source follower amplifier 102, compensation circuit 204 and compensation capacitor Cu. In an embodiment, compensation circuit 204 generates a voltage at node $V_{COMP}$ (also referred to as a "compensating node") that is 180° out of phase (e.g. in opposite phase) with the voltage at the drain node $V_{DR}$ of source follower transistor M1. Node $V_{COMP}$ is coupled to the gate of source follower transistor M1 via compensation capacitor Cu. Coupling node $V_{COMP}$ to the gate of source follower transistor M1 via capacitor Cu partially or completely neutralizes the effect of the parasitic gate-drain capacitance Cgd of source follower transistor M1 on the input impedance $Z_{IN}$ of super source follower amplifier 102. By neutralizing the effect of the parasitic gate-drain capacitance Cgd on input impedance $Z_{IN}$, the negative real part of input impedance $Z_{IN}$ can be reduced and/or made to be positive.

While FIG. 2A illustrates compensation circuit 204 as being implemented using a gain block 205 having an input coupled to the drain of source follower transistor M1, and having gain of −1, it should be understood that this is just one of many possible ways to produce signal $V_{COMP}$. For example, compensation circuit 204 may be implemented using an inverting amplifier having an input coupled to the drain of source follower transistor M1, or another type of amplifier having an input coupled to other nodes in the system. This flexibility of input nodes is illustrated by drawing the connection between the drain of super source follower transistor M1 and the input to compensation circuit 204 as a dashed line. The circuitry used to implement compensation circuit 204 may be implemented using amplifier circuits known in the art.

Super source follower circuit 102 may be implemented, for example, using a complementary metal oxide semiconductor (CMOS) process, such as a bulk digital CMOS process. Alternatively, other process technologies could be used such as bipolar process technologies. While source follower transistor M1 is shown using a PMOS transistor, it should be appreciated that source follower circuit 102 may be adapted to use an NMOS transistor using circuit design techniques known in the art.

Figure 2B:
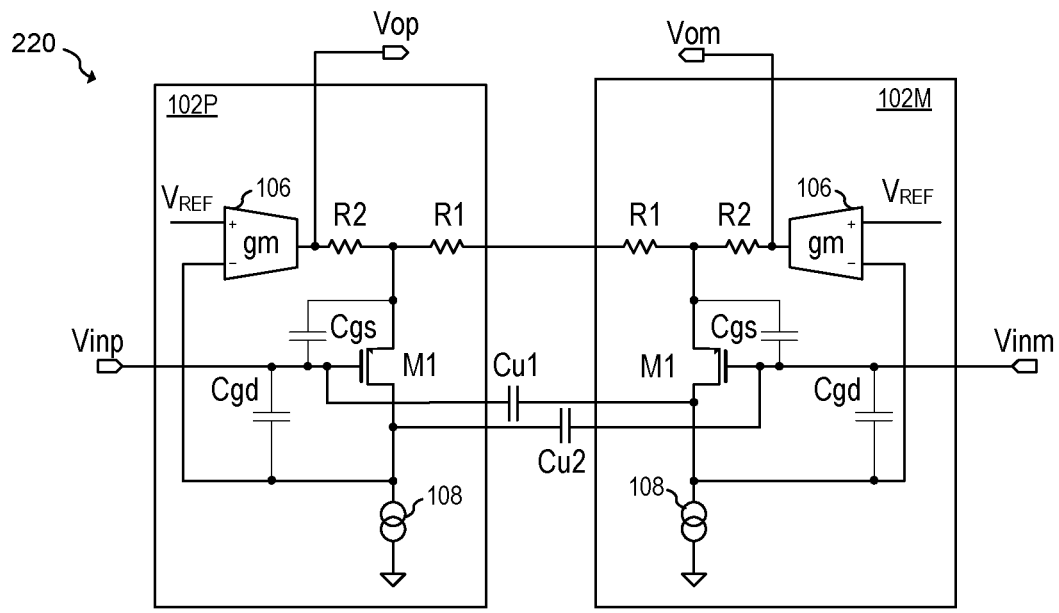

In some embodiments, the function of compensation circuit 204 is achieved by using a differential or pseudo-differential amplifier structure as shown in FIG. 2B, which illustrates a differential super source follower amplifier 220 according to a further embodiment of the present invention. As shown, differential super source follower amplifier 220 includes two single-ended super source follower amplifiers 102P and 102M and two compensation capacitors Cu1 and Cu2. As shown, both super source follower amplifiers 102P and 102M are constructed similarly to super source follower amplifier 102 described above with respect to FIGS. 1 and 2A. The input and output of super source follower amplifier 102P are respectively coupled to input node Vinp and the output node Vop, and the input and output of super source follower amplifier 102M are respectively coupled to input node Vinm and the output node Vom. In various embodiments, input nodes Vinp and Vinm are connected to input signals having an opposite phase, such as a differential input signal. For example, the inputs Vinp and Vinm may be coupled to a MEMS sensor that provides a differential output signal. Thus, when a differential input signal is provided to input nodes Vinp and Vinm, each internal node of super source follower amplifier 102P has an opposite phase with respect to each internal node of super source follower amplifier 102M. Accordingly, the drain voltage of source follower transistor M1 in super source follower amplifier 102P has an opposite phase of the drain voltage of source follower transistor M1 in super source follower amplifier 102M. The existence of these opposite phase nodes in super source follower amplifiers 102P and 102M allows super source follower amplifiers 102P and 102M to compensate each other with the addition of compensation capacitors Cu1 and Cu2 in order to reduce or eliminate the negative real part of the input resistance at input nodes Vinp and Vinm.

In some embodiments, the resistance of resistor R1 and/or resistor R2 may be adjusted such that the gain of super source follower 102 is programmable. In such embodiments, resistor R2 and/or resistor R1 is implemented as an adjustable resistor using adjustable resistor circuits known in the art. For example, resistor R1 and/or R2 may be implemented using a plurality of resistor segments that can be selected and/or shorted using one or more switching circuits (not shown). These switching circuits may be constructed, for example, using MOS switching transistors. In alternative embodiments, resistor R1 and resistor R2 may have a fixed value. In a further embodiment, resistors R1 and R2 may be omitted such that the source of transistor M1 is directly connected to the output of transconductance amplifier 106. In some embodiments, the voltage divider formed by resistors R1 and R2 may be formed by other element types besides resistors, such as capacitors.

In some embodiments, the value of capacitors Cu, Cu1 and/or Cu2 may be adjustable to provide programmable compensation of the negative input resistance of embodiment super source follower circuits. One or more of these capacitors may be implemented using programmable capacitor circuits known in the art. For example, the adjustable capacitors may be implemented using a plurality of parallel capacitors that are each coupled in parallel with a switch, such that the total capacitance value is determined by opening and closing the series switches according to various combinations. These series switches may be constructed, for example, using MOS switching transistors.

Figure 2C:
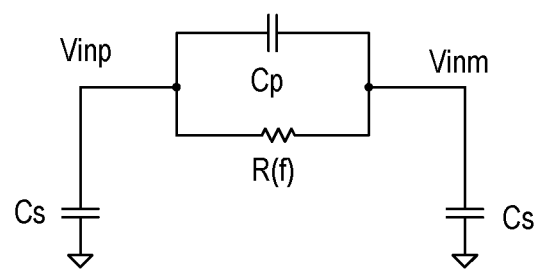
FIG. 2C illustrates a model of an input impedance of an embodiment super source follower circuit.

FIG. 2C illustrates a model of the input impedance at inputs Vinp and Vinm of differential super source follower amplifier 220 shown in FIG. 2B. As shown, the input impedance can be modeled as two shunt capacitors Cs that respectively couple input nodes Vinp and Vinm to ground, a parallel capacitance Cp coupled between inputs Vinp and Vinm, and a frequency dependent resistance R(f) coupled between inputs Vinp and Vinm. When super source follower amplifier 220 does not include compensation capacitors Cu1 and Cu2 of an adequate capacitance, frequency dependent resistance R(f) attains a negative value that may cause oscillations at the resonant frequency of a sensor to which the amplifier is coupled. However, the addition of compensation capacitors Cu1 and Cu2 to differential super source follower amplifier 220 makes frequency dependent resistance R(f) less negative or even positive at the resonant frequency of the differential MEMS sensor, which advantageously prevents oscillations.

Figure 2D:
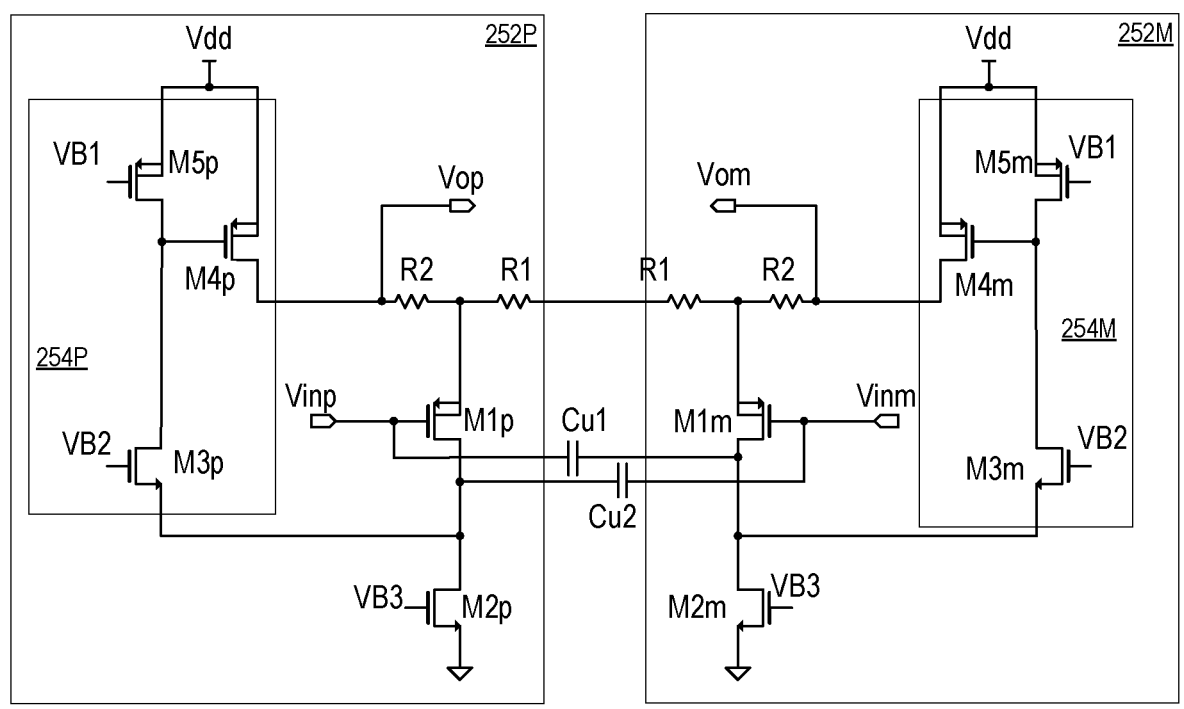
FIG. 2D illustrates a super source follower circuit according to an embodiment.

FIG. 2D illustrates a schematic of differential super source follower amplifier 250, which is an example transistor level implementation of differential super source follower amplifier 220 shown in FIG. 2B. As shown, differential super source follower amplifier 250 has a first single ended super source follower amplifier 252P coupled to input node Vinp and output node Vop, and a second single ended super source follower amplifier 252M coupled to input node Vinm and output node Vom.

First single ended super source follower amplifier includes source follower transistor M1p, resistors R1 and R2, current source transistor M2p which implements current source 108, and amplifier 254P that includes cascode transistor M3p, current source transistor M5p implementing an amplifier current source, and amplifying transistor M4p. In various embodiments, fixed dc voltages are applied to bias nodes VB1, VB2 and VB3 using bias generation circuits known in the art (not shown). For example, bias voltages applied to the gates of transistors M5p and M2p at nodes VB1 and VB2 may be generated using current source bias circuits, such as a diode connected MOSFET transistor. The bias voltage applied to bias node VB2 may be applied using cascode bias circuits known in the art. During operation, amplifier 254P monitors the voltage at the drain of source follower transistor M1P via transistors M3P and M4p, and provides a corresponding current to resistor R2. The loop formed by amplifier 254P and source follower transistor M1P lowers the output impedance at output node Vop and forces a substantially constant current to flow through super source follower transistor M1p.

Second single ended super source follower amplifier 252M includes source follower transistor M1m, resistors R1 and R2, current source transistor M2m which implements current source 108, and amplifier 254M that includes cascode transistor M3m, current source transistor M5m and amplifying transistor M4m. Second single ended super source follower amplifier 252M operates in a similar manner as single ended super source follower amplifier 252P described above.

It should be understood that the illustrated implementation of amplifiers 254P and 254M is just an example of many possible amplifier circuits that could be used to implement amplifier 106 shown in FIG. 2B. In alternative embodiments, other amplifier circuits could be used.

Compensation capacitor Cu1 is connected between the gate of source follower transistor M1m and the drain of transistor source follower transistor M1p, and compensation capacitor Cu2 is connected between the gate of source follower transistor M1p and the drain of transistor source follower transistor M1m. Compensation capacitors Cu1 and Cu2 reduce the magnitude of the negative real part of the input resistance as described in embodiments above.

In FIG. 2D, transistors M1p, M1m, M4p, M4m, M5p and M5m are implemented using PMOS transistors, and transistors M2p, M2m, M3p and M3m are implemented using NMOS transistors. In alternative embodiments different transistor types could be used. For example, the polarity of the power supply pins could be reversed along with the transistor types used to implement differential super source follower circuit 250. In such an embodiment, transistors M1p, M1m, M4p, M4m, M5p and M5m could be implemented using NMOS transistors, and transistors M2p, M2m, M3p and M3m could be implemented using PMOS transistors.

Figure 3A:
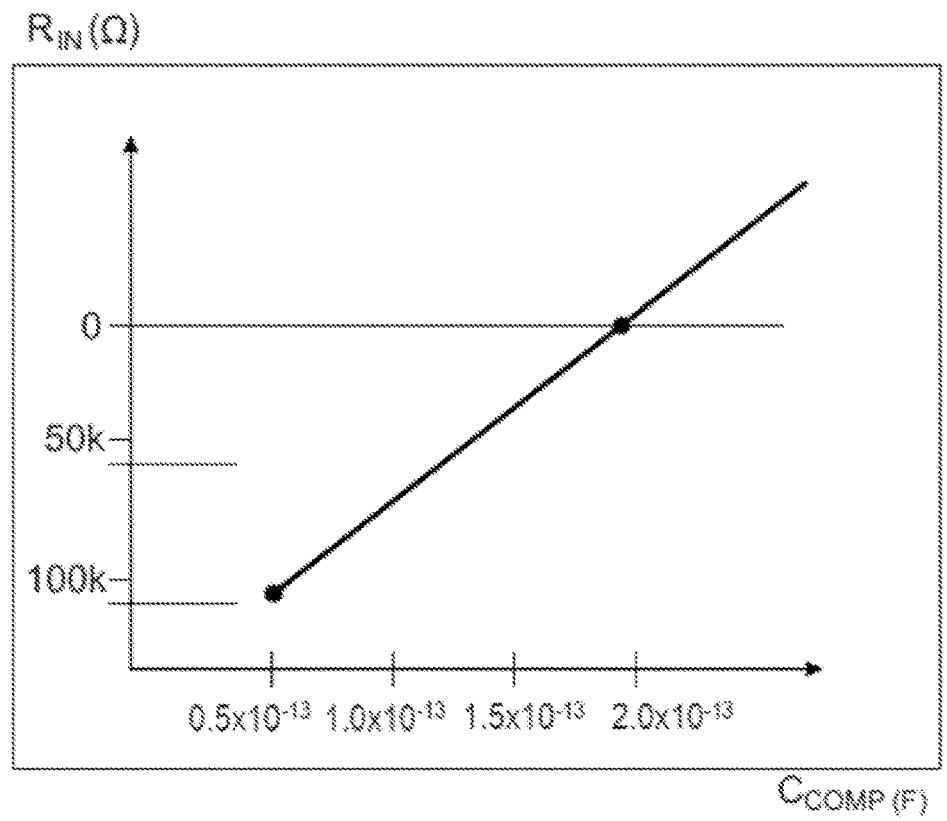
FIGS. 3A and 3B include graphs that illustrate the performance of an embodiment super source follower circuit.

FIG. 3A illustrates a graph that shows the relationship between the real part of the input resistance $R_{IN}$ with respect to the value of the capacitance $C_{COMP}$ of compensation capacitors Cu1 and Cu2 for a differential super source follower amplifier such as super source follower amplifier 220 shown in FIG. 2B. As shown, the real part of the input resistance $R_{IN}$ is about −100 KΩ for value of 50 fF for compensation capacitance $C_{COMP}$; about −50 KΩ for value of 150 fF for compensation capacitance $C_{COMP}$; and about 0 KΩ for value of 200 fF for compensation capacitance $C_{COMP}$. Thus, for a value of 200 fF for compensation capacitance $C_{COMP}$, the negative input resistance is completely compensated. Compensation capacitor values for $C_{COMP}$ greater than zero result in a positive real part of input resistance $R_{IN}$.

Figure 3B:
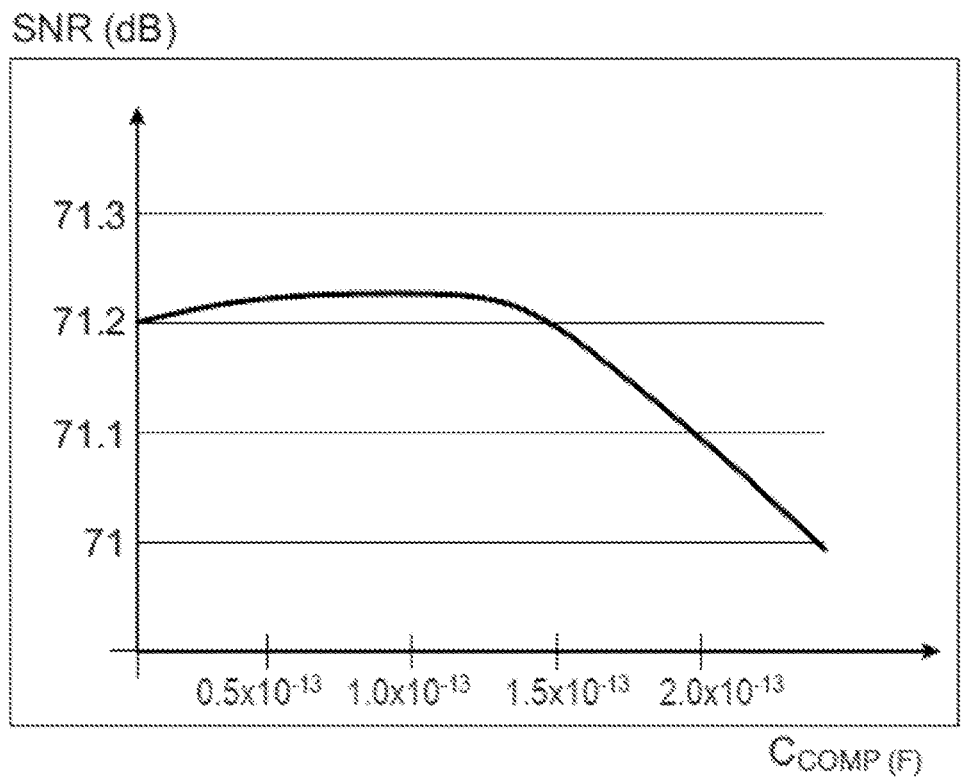

FIG. 3B illustrates a graph that shows the relationship between the signal to noise ratio (SNR) with respect to the value of the capacitance $C_{COMP}$ of compensation capacitors Cu1 and Cu2 for a differential super source follower amplifier such as super source follower amplifier 220 shown in FIG. 2B or super source follower amplifier 250 shown in FIG. 2D. As shown, the SNR is a relatively constant 71.2 dB for values of $C_{COMP}$ of less than about 150 fF. However, the SNR begins to degrade for values of $C_{COMP}$ greater than 100 fF due to input signal attenuation due to the capacitive divider effect of the additional compensation capacitance $C\text{-}_{COMP}$. In some embodiments, the value of capacitance $C_{COMP}$ can be set to a value that results in a small negative resistance in exchange for a higher SNR that obtains acceptable performance. For example, in one embodiment a value of 150 fF for capacitance $C_{COMP}$ could be used to achieve an SNR of 71.2 dB and a negative input resistance of −50 KΩ. In various embodiments, as long as the absolute value of the negative resistance at a particular frequency is less than the positive real part of the source impedance (e.g. 50 KΩ in this specific example), oscillations can be avoided.

It should be understood that the graphs of FIGS. 3A and 3B show the relationship between compensation capacitance and SNR respect to compensation capacitance for one specific embodiment under one specific set of conditions. Different implementations of embodiment super source follower circuits may achieve different results.

Figure 4:
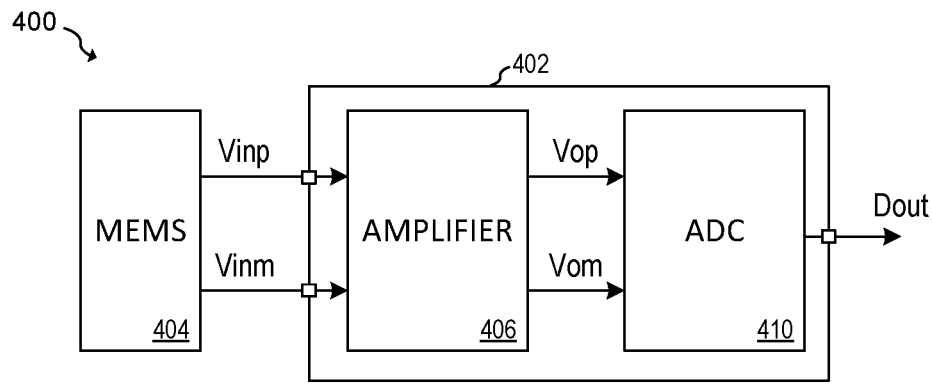
FIG. 4 illustrates a microphone system according to an embodiment.

FIG. 4 illustrates a MEMS microphone system 400 that includes differential MEMS sensor 404 coupled to a microphone interface integrated circuit 402. Integrated circuit 402 includes embodiment differential super source follower amplifier 406 and analog to digital converter 410 configured to convert the differential analog output Vop-Vom of differential super source follower amplifier 406 to a digital output Dout.

In various embodiments, MEMS sensor 404 may be implemented according to differential MEMS sensor circuits and systems known in the art. MEMS sensor 404 may be a MEMS microphone implemented, for example, as described in U.S. Pat. Nos. 9,181,080, 9,828,237 or U.S. Pat. No. 11,161,735. Alternatively, other known MEMS sensor implementations could be used. In further alternative embodiments, other signal sources besides MEMS sensors could also be used.

Differential super source follower amplifier 406 may be implemented using any of the embodiment super source follower circuits described herein. Analog to digital converter 410 may be implemented using analog to digital converter circuits known in the art. In some embodiments, analog to digital converter 410 may be implemented using a sigma delta modulator or a sigma delta analog to digital converter. Digital output Dout may be a multi-bit or single bit output.

In some embodiments, the components of integrated circuit 402 may be disposed on a single semiconductor substrate, such as a silicon substrate. Alternatively, the components of integrated circuit 402 may be disposed on more than one semiconductor substrate. In some embodiments, the components of integrated circuit 402 may be integrated on the same semiconductor substrate as MEMS sensor 404.

Figure 5:
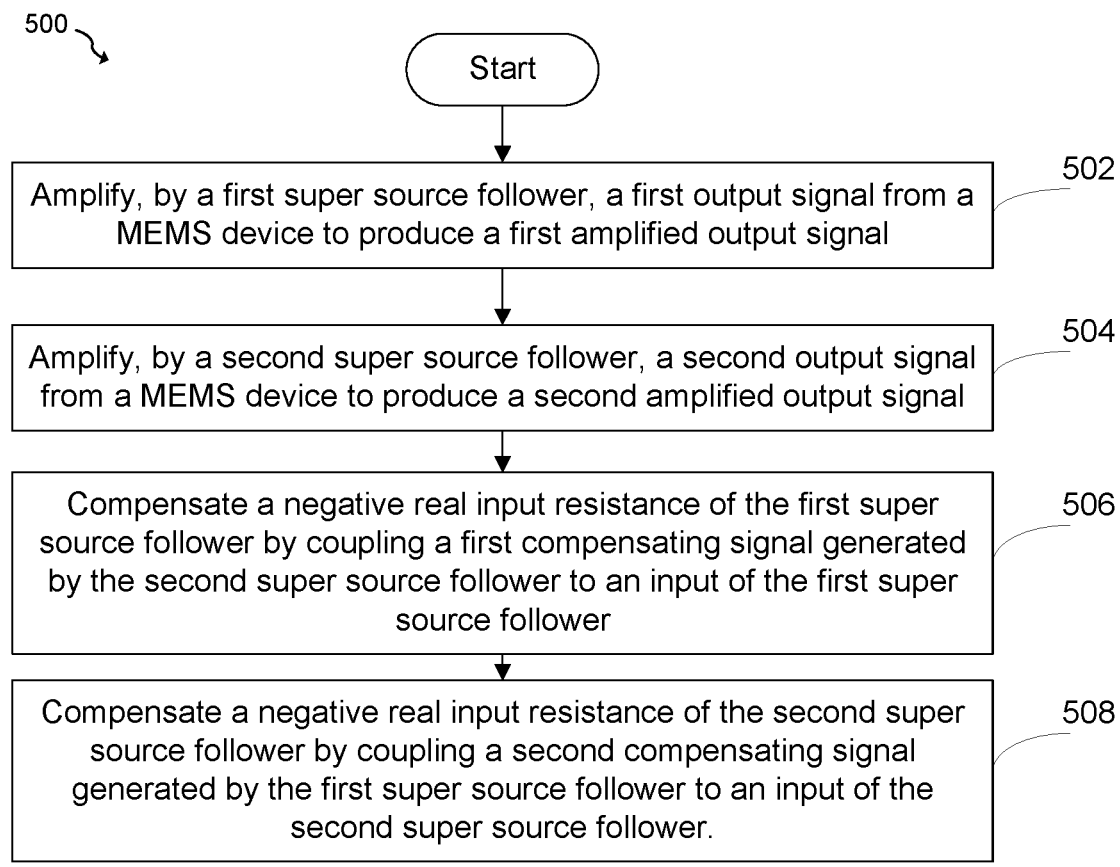
FIG. 5 illustrates a flowchart of a method of operating an embodiment super source follower circuit.

FIG. 5 illustrates a flowchart of a method 500 of operating an embodiment super source follower circuit, such as differential super source follower circuits 220 and 250 shown in FIGS. 2B and 2D described above. In step 502, a first output signal from a MEMS device is amplified by a first super source follower, and in step 504 as second output signal from the MEMS device is amplified by a second super source follower. The MEMS device may be a MEMS sensor, such as a MEMS microphone described above with respect to the embodiment of FIG. 4.

In step 506, a negative real input resistance of the first super source follower is compensated by coupling a first compensating signal generated by the second super source follower to an input of the first super source follower. Similarly, in step 508, a negative real input resistance of the second super source follower is compensated by coupling a second compensating signal generated by the first super source follower to an input of the second super source follower. In some embodiments, the first and second compensating signals are generated at the drain nodes of the source follower transistors of the first and second super source followers and are coupled to the respective inputs using capacitors, such as capacitors Cu1 and Cu2 described above with respect to FIGS. 2B and 2B. In various embodiments, step 502 may be performed in parallel with step 504 and step 506 may be performed in parallel with step 508.

Embodiments of the present invention are summarized here. Other embodiments can also be understood from the entirety of the specification and the claims filed herein.

Example 1. A circuit including: a first super source follower; a compensation circuit having a compensating node configured to provide a voltage of opposite phase of a voltage of an internal node of the first super source follower; and a first compensation capacitor coupled between an input of the first super source follower and the compensating node of the compensation circuit.

Example 2. The circuit of example 1, where the first super source follower includes a first source follower transistor, and a first amplifier having an input coupled to a drain of the first source follower transistor and an output coupled to a source of the first source follower transistor.

Example 3. The circuit of example 2, where the internal node of the first super source follower is the drain of the first source follower transistor.

Example 4. The circuit of one of example 2 or 3, further including a voltage divider coupled between the output of the first amplifier and the source of the first source follower transistor.

Example 5. The circuit of one of examples 2 to 4, where the first amplifier includes: a first amplifying transistor having a gate coupled to the drain of the first source follower transistor and a drain coupled to the source of the first source follower transistor.

Example 6. The circuit of one of examples 2 to 5, further including a first cascode transistor coupled between the drain of the first source follower transistor and the gate of the first amplifying transistor.

Example 7. The circuit of one of examples 2 to 6, further including: a first current source transistor coupled to the drain of the first source follower transistor; and a second current source transistor coupled to the gate of the first amplifying transistor.

Example 8. The circuit of one of examples 1 to 7, where the compensation circuit includes a second super source follower.

Example 9. The circuit of one of examples 1 to 8, where the second super source follower includes: a second source follower transistor; and a second amplifier having an input coupled to a drain of the second source follower transistor and an output coupled to a source of the second source follower transistor, where the compensating node is at the drain of the second source follower transistor.

Example 10. The circuit of example 9, further including a second compensation capacitor coupled between a gate of the second source follower transistor and the drain of the first source follower transistor, where the drain of the second source follower transistor includes the compensating node of the compensation circuit.

Example 11. The circuit of one of examples 1 to 10, further including a MEMS device coupled to an input of the first super source follower.

Example 12. A circuit including: a first super source follower having an input configured to be coupled to a first output terminal of a MEMS device; a second super source follower having an input configured to be coupled to a second output terminal of the MEMS device; a first capacitor coupled between the input of the first super source follower and an internal node of the second super source follower; and a second capacitor coupled between the input of the second super source follower and an internal node of the first super source follower.

Example 13. The circuit of example 12, where; the first super source follower includes a first source follower transistor, and a first amplifier having an input coupled to a drain of the first source follower transistor and an output coupled to a source of the first source follower transistor; and the second super source follower includes a second source follower transistor, and a second amplifier having an input coupled to a drain of the second source follower transistor and an output coupled to a source of the second source follower transistor.

Example 14. The circuit of example 13, where: the internal node of the first super source follower is directly connected to the drain of the first source follower transistor; and the internal node of the second super source follower is directly connected to the drain of the second source follower transistor.

Example 15. The circuit of one of examples 13 or 14, further including: a first resistor coupled between the output of the first amplifier and the source of the first source follower transistor; a second resistor coupled between the output of the second amplifier and the source of the second source follower transistor; and a third resistor coupled between the source of the first source follower transistor and the source of the second source follower transistor.

Example 16. The circuit of one of examples 13 to 15, where: the first amplifier includes a first amplifying transistor having a gate coupled to the drain of the first source follower transistor and a drain coupled to the source of the first source follower transistor; and the second amplifier includes a second amplifying transistor having a gate coupled to the drain of the second source follower transistor and a drain coupled to the source of the second source follower transistor.

Example 17. The circuit of example 16, further including: a first cascode transistor coupled between the drain of the first source follower transistor and the gate of the first amplifying transistor; and a second cascode transistor coupled between the drain of the second source follower transistor and the gate of the second amplifying transistor.

Example 18. The circuit of one of examples 16 or 17, where: the first source follower transistor, the second source follower transistor, the first amplifying transistor and the second amplifying transistor include PMOS transistors; and the first cascode transistor and the second cascode transistor include NMOS transistors.

Example 19. The circuit of one of examples 12 to 18, further including the MEMS device.

Example 20. The circuit of one of examples 12 to 19, where the first super source follower, the second super source follower, the first capacitor and the second capacitor are disposed on a single integrated circuit.

Example 21. A method including: amplifying, by a first super source follower, a first output signal from a MEMS device to produce a first amplified output signal; amplifying, by a second super source follower, a second output signal from a MEMS device to produce a second amplified output signal; compensating a negative real input resistance of the first super source follower by coupling a first compensating signal generated by the second super source follower to an input of the first super source follower; and compensating a negative real input resistance of the second super source follower by coupling a second compensating signal generated by the first super source follower to an input of the second super source follower.

Example 22. The method of example 21, where: coupling the first compensating signal is performed using a first capacitor; and coupling the first compensating signal is performed using a second capacitor.

Example 23. A circuit including: a first transistor having a control node coupled to a first input node; a first amplifier having an input coupled to an output node of the first transistor and an output coupled to a reference node of the first transistor; a second transistor having a control node coupled to a second input node; a second amplifier having an input coupled to an output node of the second transistor and an output coupled to a reference node of the second transistor; a first capacitor coupled between the control node of the first transistor and the output node of the second transistor; and a second capacitor coupled between the control node of the second transistor and the output node of the first transistor.

Example 24. The circuit of example 23, where: the first transistor includes a first MOSFET, the control node of the first transistor includes a gate of the first MOSFET, the output node of the first transistor includes a drain of the first MOSFET, and the reference node of the first transistor includes a source of the first MOSFET; and the second transistor includes a first MOSFET, the control node of the second transistor includes a gate of the first MOSFET, the output node of the second transistor includes a drain of the first MOSFET, and the reference node of the second transistor includes a source of the first MOSFET.

Example 25. The circuit of one of examples 23 or 24, where: the first amplifier includes a first amplifying transistor having a control node coupled to the output node of the first transistor and an output node coupled to the reference node of the first transistor; and the second amplifier includes a second amplifying transistor having a control node coupled to the output node of the second transistor and an output node coupled to the reference node of the second transistor.

Example 26. The circuit of example 25, further including: a first current source coupled to the reference node of the first transistor; a first cascode transistor coupled between the reference node of the first transistor and the control node of the first amplifying transistor; a first amplifier current source coupled to the control node of the first amplifying transistor; a second current source coupled to the reference node of the second transistor; a second cascode transistor coupled between the reference node of the second transistor and the control node of the second amplifying transistor; and a second amplifier current source coupled to the control node of the second amplifying transistor.

Example 27. The circuit of example 26, where: the first transistor, the second transistor, the first amplifying transistor, the second amplifying transistor, the first amplifier current source, and the second amplifier current source each includes a respective PMOS transistor; and the first current source, the second current source, the first cascode transistor and the second cascode transistor each includes a respective NMOS transistor.

Example 28. The circuit of one of examples 23 to 27, further including: a first resistor coupled between the output of the first amplifier and the reference node of the first transistor; a second resistor coupled between the reference node of the first transistor and the reference node of the second transistor; and a third resistor coupled between the output of the second amplifier and the reference node of the second transistor.

Example 29. The circuit of example 28, where at least one of the first resistor, the second resistor or the third resistor includes an adjustable resistor.

Example 30. The circuit of one of examples 23 to 29, where the first capacitor and the second capacitor each includes a respective programmable capacitor.

Example 31. The circuit of one of examples 23 to 30, further including a MEMS device having a first output node coupled to the first input node, and a second output node coupled to the first input node.

Example 32. The circuit of one of examples 23 to 31, where a capacitance of the first capacitor and a capacitance of the second capacitor is set such that a first impedance at the first input node and a second impedance at the second input node includes impedances having a positive real part.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a first super source follower;
   a compensation circuit having a compensating node configured to provide a voltage of opposite phase of a voltage of an internal node of the first super source follower; and
   a first compensation capacitor coupled between an input of the first super source follower and the compensating node of the compensation circuit.

2. The circuit of claim 1, wherein the first super source follower comprises a first source follower transistor, and a first amplifier having an input coupled to a drain of the first source follower transistor and an output coupled to a source of the first source follower transistor.

3. The circuit of claim 2, wherein the internal node of the first super source follower is the drain of the first source follower transistor.

4. The circuit of claim 2, further comprising a voltage divider coupled between the output of the first amplifier and the source of the first source follower transistor.

5. The circuit of claim 2, wherein the first amplifier comprises:
   a first amplifying transistor having a gate coupled to the drain of the first source follower transistor and a drain coupled to the source of the first source follower transistor.

6. The circuit of claim 2, wherein the compensation circuit comprises a second super source follower.

7. The circuit of claim 6, wherein the second super source follower comprises:
   a second source follower transistor; and
   a second amplifier having an input coupled to a drain of the second source follower transistor and an output coupled to a source of the second source follower transistor, wherein the compensating node is at the drain of the second source follower transistor.

8. The circuit of claim 7, further comprising a second compensation capacitor coupled between a gate of the second source follower transistor and the drain of the first source follower transistor, wherein the drain of the second source follower transistor comprises the compensating node of the compensation circuit.

9. The circuit of claim 1, further comprising a MEMS device coupled to an input of the first super source follower.

10. A circuit comprising:
    a first super source follower having an input configured to be coupled to a first output terminal of a MEMS device;
    a second super source follower having an input configured to be coupled to a second output terminal of the MEMS device;
    a first capacitor coupled between the input of the first super source follower and an internal node of the second super source follower; and
    a second capacitor coupled between the input of the second super source follower and an internal node of the first super source follower.

11. The circuit of claim 10, wherein;
    the first super source follower comprises a first source follower transistor, and a first amplifier having an input coupled to a drain of the first source follower transistor and an output coupled to a source of the first source follower transistor; and
    the second super source follower comprises a second source follower transistor, and a second amplifier having an input coupled to a drain of the second source follower transistor and an output coupled to a source of the second source follower transistor.

12. The circuit of claim 11, wherein:
    the internal node of the first super source follower is directly connected to the drain of the first source follower transistor; and
    the internal node of the second super source follower is directly connected to the drain of the second source follower transistor.

13. The circuit of claim 11, further comprising:
    a first resistor coupled between the output of the first amplifier and the source of the first source follower transistor;
    a second resistor coupled between the output of the second amplifier and the source of the second source follower transistor; and
    a third resistor coupled between the source of the first source follower transistor and the source of the second source follower transistor.

14. The circuit of claim 11, wherein:
    the first amplifier comprises a first amplifying transistor having a gate coupled to the drain of the first source follower transistor and a drain coupled to the source of the first source follower transistor; and
    the second amplifier comprises a second amplifying transistor having a gate coupled to the drain of the second source follower transistor and a drain coupled to the source of the second source follower transistor.

15. The circuit of claim 14, further comprising:
    a first cascode transistor coupled between the drain of the first source follower transistor and the gate of the first amplifying transistor; and
    a second cascode transistor coupled between the drain of the second source follower transistor and the gate of the second amplifying transistor.

16. The circuit of claim 15, wherein:
the first source follower transistor, the second source follower transistor, the first amplifying transistor and the second amplifying transistor comprise PMOS transistors; and
the first cascode transistor and the second cascode transistor comprise NMOS transistors.

17. The circuit of claim 10, further comprising the MEMS device.

18. The circuit of claim 10, wherein the first super source follower, the second super source follower, the first capacitor and the second capacitor are disposed on a single integrated circuit.

19. A method comprising:
amplifying, by a first super source follower, a first output signal from a MEMS device to produce a first amplified output signal;
amplifying, by a second super source follower, a second output signal from the MEMS device to produce a second amplified output signal;
compensating a negative real input resistance of the first super source follower by coupling a first compensating signal generated by the second super source follower to an input of the first super source follower; and
compensating a negative real input resistance of the second super source follower by coupling a second compensating signal generated by the first super source follower to an input of the second super source follower.

20. The method of claim 19, wherein:
coupling the first compensating signal is performed using a first capacitor; and
coupling the first compensating signal is performed using a second capacitor.

* * * * *